(12) United States Patent
Oku et al.

(10) Patent No.: US 10,079,201 B1
(45) Date of Patent: Sep. 18, 2018

(54) LEAD FRAME

(71) Applicant: NICHIA CORPORATION, Anan-shi, Tokushima (JP)

(72) Inventors: Hironao Oku, Anan (JP); Toshiyuki Hashimoto, Anan (JP); Mitsuhiro Isono, Itano-gun (JP); Takao Ishihara, Oogaki (JP); Takaaki Kato, Takamatsu (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/924,071

(22) Filed: Mar. 16, 2018

(30) Foreign Application Priority Data

Mar. 17, 2017 (JP) ................................ 2017-053207

(51) Int. Cl.
| | |
|---|---|
| *H01L 23/52* | (2006.01) |
| *H01L 23/495* | (2006.01) |
| *H01L 33/64* | (2010.01) |
| *H01L 33/62* | (2010.01) |
| *H01L 21/56* | (2006.01) |
| *H01L 21/48* | (2006.01) |

(52) U.S. Cl.
CPC ........ *H01L 23/52* (2013.01); *H01L 23/49541* (2013.01); *H01L 23/49568* (2013.01); *H01L 33/62* (2013.01); *H01L 33/647* (2013.01); *H01L 21/4821* (2013.01); *H01L 21/565* (2013.01)

(58) Field of Classification Search
CPC .......... H05K 1/14; H05K 1/141; H05K 1/142; H05K 1/144; H05K 1/145; H05K 1/147; H05K 1/148; H01L 23/52
See application file for complete search history.

(56) References Cited

U.S. PATENT DOCUMENTS

| | | |
|---|---|---|
| 2013/0221509 A1 | 8/2013 | Oda et al. |
| 2014/0252574 A1 | 9/2014 | Nakabayashi et al. |

FOREIGN PATENT DOCUMENTS

| | | |
|---|---|---|
| JP | 2012-089547 A | 5/2012 |
| WO | WO-2012/060336 A1 | 5/2012 |
| WO | WO-2014/136824 A1 | 9/2014 |

*Primary Examiner* — Jeremy C Norris
(74) *Attorney, Agent, or Firm* — Foley & Lardner LLP

(57) ABSTRACT

A lead frame includes: a plurality of units each including a first lead portion and a second lead portion arranged in a first direction, wherein the units are arranged in the first direction and in a second direction perpendicular to the first direction, and the first lead portion and the second lead portion of each unit are adjacent, in the second direction, to the first lead portion and the second lead portion of an adjacent one of the units that is adjacent in the second direction; a plurality of first suspension portions; and a plurality of connecting portions. Each of the first suspension portions connects, in the second direction, the first lead portions of units that are adjacent to each other in the second direction.

11 Claims, 12 Drawing Sheets

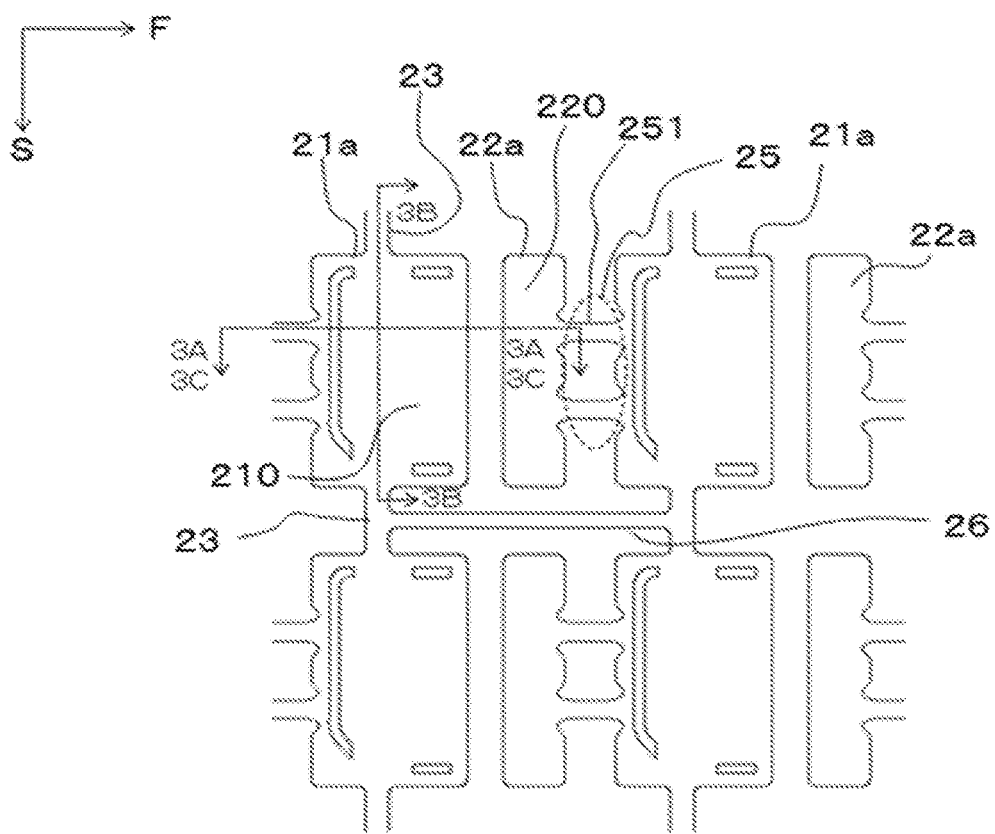

LEAD FRAME

CROSS-REFERENCE TO RELATED APPLICATION

This application claims priority to Japanese Patent Application No. 2017-053207, filed on Mar. 17, 2017, the contents of which are hereby incorporated by reference in their entirety.

BACKGROUND

The present disclosure relates to a lead frame.

Generally, light-emitting devices using light-emitting elements such as light-emitting diodes are widely used for various light sources of lighting apparatuses, and the like. Such light-emitting devices can be obtained by, for example, manufacturing a light-emitting device array including a plurality of light-emitting elements mounted on a resin-covered lead frame (i.e., a lead frame covered with molded resin), and then cutting and separating the light-emitting device array into individual light emitting devices.

In such a light-emitting device array, a lead frame may be used that is subjected to a pressing process at portions to be cut, in order to reduce abrasion of the dicer blade at the time of separation to facilitate the cutting of the lead frame (see e.g., Japanese Patent Publication No. 2012-89547).

SUMMARY

In the lead frame described in Japanese Patent Publication No. 2012-89547, each of a portion to be the first lead and a portion to be the second lead is connected to other portions of the lead frame in the x direction and the y direction. When such a lead frame is subjected to a pressing process, the stress applied by the pressing process is likely to remain as a residual stress at the pressed portions, and the lead frame may possibly be distorted or warped. As a result, a manufacturing error may possibly occur in subsequent steps, i.e., the step of integrally molding a resin together with a lead frame or the step of mounting light-emitting elements thereon.

In view of this, an object of certain embodiments of the present disclosure is to provide a lead frame in which the residual stress is reduced.

A lead frame according to one embodiment of the present disclosure includes: a plurality of units each including a first lead portion and a second lead portion, the first lead portion and the second lead portion arranged in a first direction, wherein the units are arranged in the first direction and in a second direction perpendicular to the first direction, and the first lead portion and the second lead portion of each unit are adjacent, in the second direction, to the first lead portion and the second lead portion of an adjacent one of the units that is adjacent in the second direction; a plurality of first suspension portions; and a plurality of connecting portions. Each of the first suspension portions connects, in the second direction, the first lead portions of units that are adjacent to each other in the second direction. Each of the connecting portions connects together the first lead portion of a corresponding one of the units and the second lead portion of an adjacent one of the units that is adjacent to the corresponding one of the units in the first direction. The second lead portion of each of the units is connected to the first lead portion of the adjacent one of the units only via the connecting portion.

According to certain embodiments of the present disclosure, it is possible to provide a lead frame with which the residual stress is reduced.

BRIEF DESCRIPTION OF THE DRAWINGS

FIG. 2C is a partial enlarged view showing a plurality of (2×2) units 1 of FIG. 2A.

DETAILED DESCRIPTION

Figure 1A:
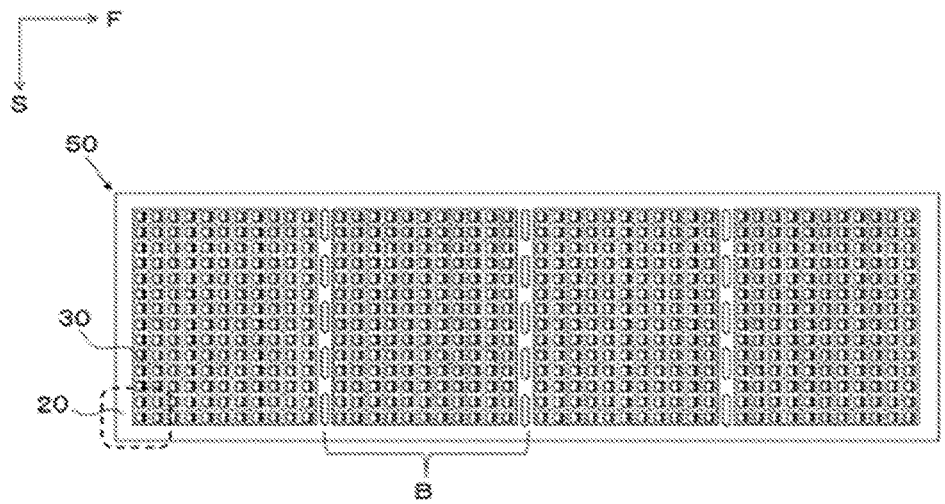
FIG. 1A is a schematic top view showing a resin-covered lead frame using a lead frame of a first embodiment of the present disclosure, when viewed from the upper surface side.

Details of various embodiments will be described below with reference to the drawings. Parts or members with the same reference numeral in different drawings indicate the same or similar parts or members.

Moreover, the description below is intended to illustrate embodiments of a lead frame to give a concrete form to the technical idea of the present disclosure. The present disclosure is not intended to be limited thereto. The size, material, shape, relative arrangement, etc., of the components are intended to be illustrative but not to limit the scope of the present disclosure thereto, unless otherwise specified. The size, relative arrangement, etc., of the members shown in each figure may be exaggerated for ease of understanding.

Note that in the present specification and in the figures, the first direction refers to the lateral direction including both the rightward direction and the leftward direction. The second direction refers to the upward-downward direction including both the upward direction and the downward direction.

In embodiments described below, the terms "unit," "package region" (i.e., a region corresponding to an individual package), and "resin-covered lead frame" may be used both before and after disposing light-emitting elements, wires, etc. Also, terms, such as "resin portion" may be used both before and after the separation.

First Embodiment

Resin-Covered Lead Frame 50

Figure 1B:
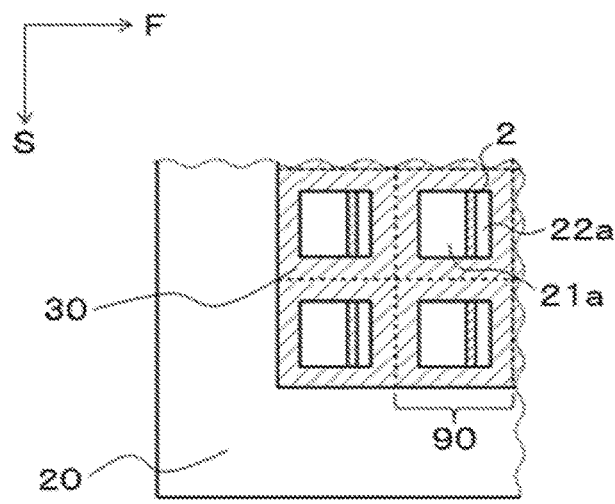
FIG. 1B is a partial enlarged view showing, on an enlarged scale, an area surrounded by a broken line in FIG. 1A.

A resin-covered lead frame 50 using a lead frame 20 according to a first embodiment of the present disclosure, will be described. FIG. 1A is a schematic top view showing the resin-covered lead frame 50 when viewed form the upper surface side, and FIG. 1B is a partial enlarged view of an area surrounded by a broken line in FIG. 1A.

The resin-covered lead frame 50 includes the lead frame 20, and a resin portion 30 formed integrally with the lead frame 20. The resin-covered lead frame 50 defines a plurality of recesses 2 on at an upper side thereof. A portion to be the first lead after the separation (hereinafter may be referred to as "a first lead portion 21a") and a portion to be the second lead after the separation (hereinafter may be referred to as "a second lead portion 22a") are both located on the bottom surface of each of the recesses 2. A light-emitting element and a sealing member, which will be described below, are arranged in the recess 2.

The resin-covered lead frame 50 includes one or more blocks B. Each block B includes a plurality of package regions 90 in the first direction F, and in the second direction S perpendicular to the first direction F. FIG. 1A shows an example in which four blocks B are arranged in the first direction F. In each block B, each package region 90 is a region surrounded by cutting lines (dotted lines) extending in the first direction F and in the second direction S in FIG. 1B. A package region 90 includes a first lead portion 21a, a second lead portion 22a, and a part of the resin portion 30. The resin portion 30 is integrally formed over a single package region 90 and adjacent ones of package regions 90. In the resin-covered lead frame 50 shown in FIG. 1A and FIG. 1B, a portion of the resin portion 30 forming the upper surface of a single package region 90, a portion of the resin portion 30 forming the upper surface of another package region 90, and a portion of the resin portion 30 located in the vicinity of the cutting line between two package regions 90 are substantially in the same plane.

Lead Frame 20

Figure 2A:
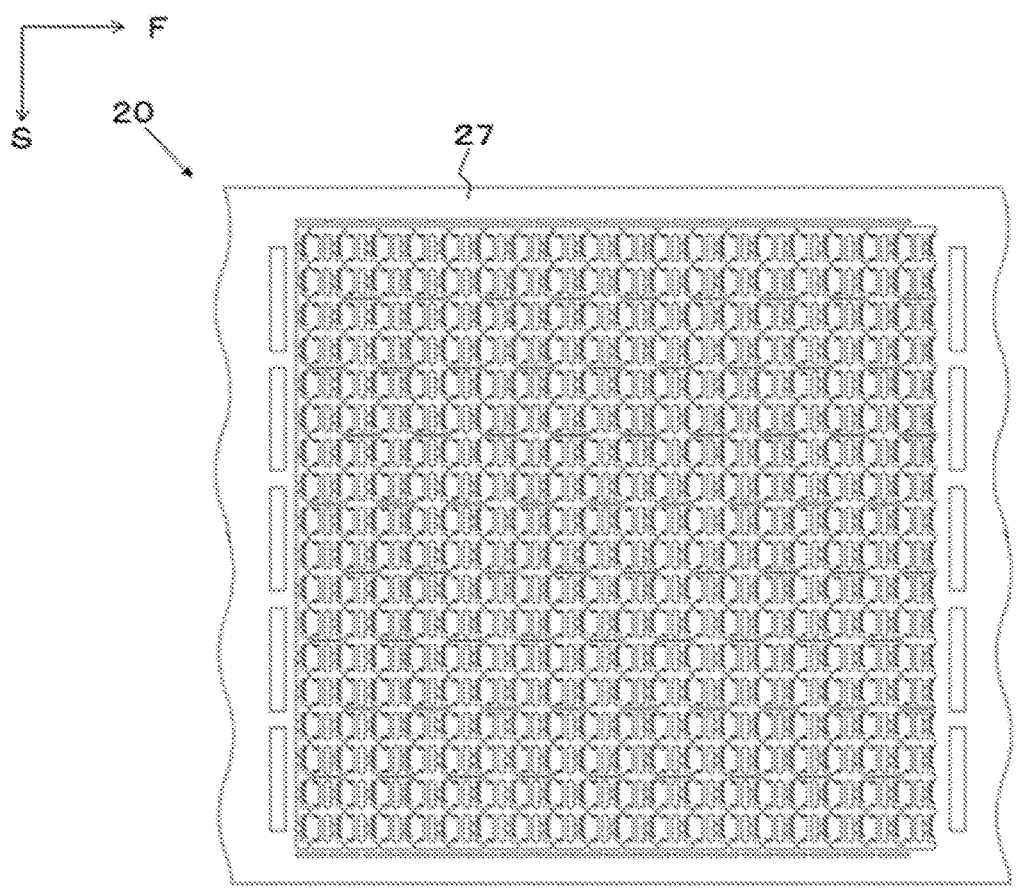
FIG. 2A is a schematic top view showing a lead frame corresponding to a single block B of the resin-covered lead frame shown in FIG. 1A.
Figure 2B:
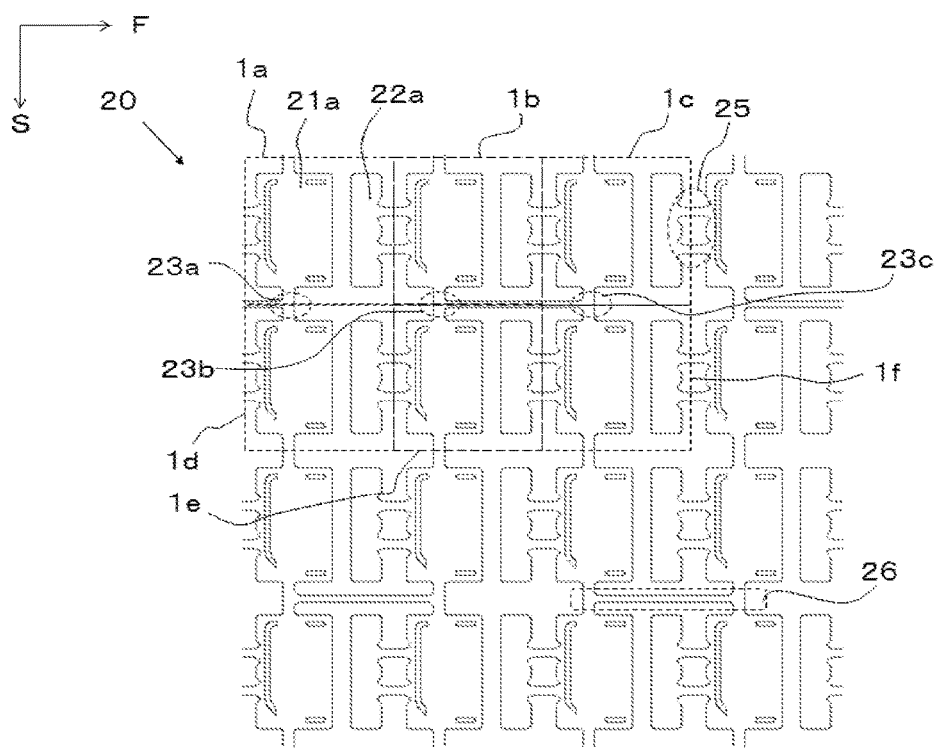
FIG. 2B is a partial enlarged view showing a plurality of (4×4) units 1 of FIG. 2A.

FIG. 2A is a schematic top view showing the lead frame 20 corresponding to a single block B of the resin-covered lead frame 50 shown in FIG. 1A. FIG. 2B is a partial enlarged view showing a plurality of (4×4) units 1 of FIG. 2A. FIG. 2C is a partial enlarged view showing a plurality of (2×2) units 1 of FIG. 2A. The lead frame 20 is a member that can be a part of the resin-covered lead frame 50, as described above, and has a rectangular shape elongated in the first direction F when viewed from above. The lead frame 20 includes a frame 27, a plurality of units 1 each including a first lead portion 21a and a second lead portion 22a, a plurality of first suspension portions 23, and a plurality of connecting portions 25.

Plurality of Units 1

The lead frame 20 includes a plurality of units 1 arranged in the first direction F and in the second direction S. Each unit 1 includes a first lead portion 21a and a second lead portion 22a that are arranged in the first direction F. In the second direction S, the first lead portion 21a and the second lead portion 22a of each unit 1 are adjacent to the first lead portion 21a and the second lead portion 22a, respectively, of an adjacent one of the plurality of units 1. More specifically, in the lead frame 20 shown in FIG. 2B, the first lead portion 21a and the second lead portion 22a of a unit 1a, the first lead portion 21a and the second lead portion 22a of a unit 1b, and the first lead portion 21a and the second lead portion 22a of a unit 1c are arranged in this order along the first direction F. In the second direction S, the first lead portion 21a and the second lead portion 22a of the unit 1a are adjacent to the first lead portion 21a and the second lead portion 22a of an unit 1d, respectively, the first lead portion 21a and the second lead portion 22a of the unit 1b are adjacent to the first lead portion 21a and the second lead portion 22a of an unit 1e, respectively, and the first lead portion 21a and the second lead portion 22a of the unit 1c are adjacent to the first lead portion 21a and the second lead portion 22a of a unit 1f, respectively.

After the formation of the resin portion 30, each of the units 1, together with a corresponding part of the resin portion 30, forms a respective one of the package regions 90. Then, cutting along the dicing lines (dotted lines) allows the lead portions of each unit 1 to function mainly as electrodes of the package. With a light-emitting element mounted on each of the package regions 90, regions each corresponding to a respective one of light-emitting devices can be obtained. That is, the lead portions of each of the units 1 are conductive and, when a light-emitting device is obtained, function as electrodes for supplying electricity to a light-emitting element 10 in the package. In the lead frame 20 of the first embodiment, each unit 1 includes a first lead portion 21a and a second lead portion 22a that function as electrodes. Each unit 1 may also include a third lead portion, in addition to the first lead portion 21a and the second lead portion 22a. In the case where each unit 1 includes the first lead portion 21a, the second lead portion 22a and a third lead, the third lead portion is disposed between the first lead portion 21a and the second lead portion 22a. With this arrangement, when a light-emitting device is obtained, the third lead portion functions as a heat radiating member, for example, while the first lead portion 21a and the second lead portion 22a function as electrodes. A lead frame in which each unit 1 includes a third lead will be described in another embodiment.

As shown in FIG. 2C, the first lead portion 21a includes a main body portion 210, a portion of the first suspension portion 23 connected to the main body portions 210, and a portion of a corresponding one of the connecting portions 25 connected to the main body portion 210. The second lead portion 22a includes a main body portion 220 and a portion of a corresponding one of the connecting portions 25 connected to the main body portion 220. The main body portion 210, 220 is a portion where a light-emitting element 10 is placed, and to which wires, etc. are connected. The first suspension portion 23 connects, in the second direction S, the first lead portions 21a of two units 1 that are adjacent to each other in the second direction S. The connecting portion 25 connects first lead portion of one unit 1 and the second lead portion 22a of another unit 1 that is adjacent to the unit 1 in the first direction F. Specifically, between two units 1 that are adjacent to each other in the second direction S, the first suspension portion 23 connects together the main body portion 210 of the first lead portion 21a of one unit 1 and the main body portion 210 of the first lead portion 21a of the other unit 1. Between two units 1 that are adjacent to each other in the first direction F, the connecting portion 25 connects together the main body portion 220 of the second lead portion 22a of one unit 1 and the main body portion 210 of the first lead portion 21a of the other unit 1.

More specifically, in the lead frame 20 shown in FIG. 2B, the main body portion 210 of the first lead portion 21a of the unit 1a and the main body portion 210 of the first lead portion 21a of the unit 1d are connected together by a first suspension portion 23a, the main body portion 210 of the first lead portion 21a of the unit 1b and the main body portion 210 of the first lead portion 21a of the unit 1e are connected together by a first suspension portion 23b, and the main body portion 210 of the first lead portion 21a of the unit 1c and the main body portion 210 of the first lead portion 21a of the unit 1f are connected together by a first suspension portion 23c.

The main body portion 220 of the second lead portion 22a of the unit 1a and the main body portion 210 of the first lead portion 21a of the unit 1b are connected together by the connecting portion 25, and the main body portion 220 of the second lead portion 22a of the unit 1b and the main body portion 210 of the first lead portion 21a of the unit 1c are connected together by the connecting portion 25. This is similar in the connecting portions 25 between the units 1d to 1f.

The second lead portion 22a is connected to its adjacent first lead portion 21a only via a respective one of the connecting portions 25. In other words, the second lead portion 22a is not connected to any portion of the lead frame other than the connecting portion 25, and is not connected to the first suspension portion 23 or a support portion 26 to be described below. Thus, even when the connecting portion 25, the first suspension portion 23, the support portion 26, etc., of the lead frame 20 are subjected to a pressing process, the stress to be applied on the first lead portion 21a and the second lead portion 22a can be released at the second lead portion 22a side, and it is possible to reduce the stress that remains in the lead frame 20. As a result, it is possible to reduce the distortion or warp of the lead frame 20. Even in the case where the lead frame 20 is not subjected to a pressing process, a stress may possibly be applied on the lead frame 20 when, for example, the lead frame 20 is carried around within a manufacturing step. Even in such a case, the stress to be applied on the lead frame 20 can be released at the second lead portion 22a side, and it is possible to reduce the distortion or warpage of the lead frame 20.

Figure 3A:
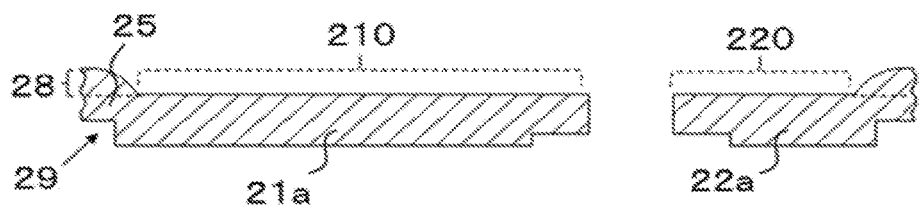
FIG. 3A is a schematic end view taken along line 3A-3A in FIG. 2C.
Figure 3B:
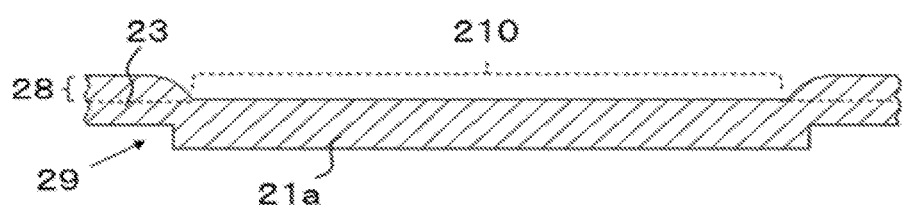
FIG. 3B is a schematic end view taken along line 3B-3B in FIG. 2C.
Figure 3C:
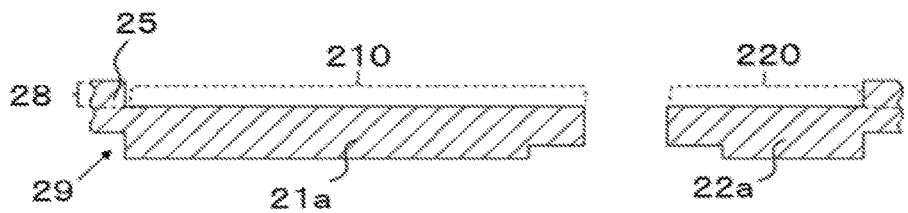
FIG. 3C is a schematic end view taken along line 3C-3C in FIG. 2C.

FIG. 3A is a schematic end view taken along line 3A-3A of FIG. 2C, FIG. 3B is a schematic end view taken along line 3B-3B of FIG. 2C, and FIG. 3C is a schematic end view taken along line 3C-3C of FIG. 2C. As shown in FIG. 3A and FIG. 3B, the connecting portion 25 and the first suspension portion 23 may have raised portions 28 that is at a higher position than a position of the upper surface of each of the main body portions 210 and 220 of the first lead portion 21a and the second lead portion 22a. The raised portions 28 can be formed by performing a pressing process in which the lower surfaces of the connecting portion 25 and the first suspension portion 23 is pressed from the lower surface side toward the upper surface side. That is, by the pressing processing, a portion of each connecting portion 25 and a portion of the first suspension portion 23 are depressed from the lower surface side toward the upper surface side (i.e., the depression 29 is formed) to be raised toward the upper surface side at the volume of a part of the recess. With the raised portion 28 and the depression 29 formed in each of the connecting portion 25 and the first suspension portion 23, the area of a portion of each of the connecting portion 25 and the first suspension portion 23 adhered with the resin portion 30 can be increased, so that it is possible to improve the adhesion between the lead frame 20 and the resin portion 30. The height of the raised portion 28 is preferably 35% to 60% with respect to the thickness of the main body portion 210, 220. Thus, it is possible to prevent the crack of the resin portion 30 and the breakage of the connecting portion, etc., in the step of separating. Moreover, it is possible to improve the adhesion with the resin portion 30 while maintaining the strength of the lead frame 20. The upper surface of the connecting portion 25 and the first suspension portion 23 may be at the same height as the upper surface of the main body portions 210 and 220 of the first lead portion 21a and the second lead portion 22a. In such a case, the lead frame is subjected to an etching processing, instead of a pressing processing. More specifically, portions of the lead frame that correspond to the connecting portions 25 and the first suspension portions 23 are etched from the lower surface side. For the etching method, any one of dry etching or wet etching is employed, but wet etching is preferably employed.

Note that the raised portion 28 may have a shape in which at least a part of the upper surface is curved as shown in FIG. 3A and FIG. 3B, or may have a shape in which an end portion of the upper surface has a corner as shown in FIG. 3C. The raised portion 28 shown in FIG. 3A has a shape in which the entire upper surface thereof is curved, and the raised portion 28 shown in FIG. 3B has a shape in which an end portion of the upper surface is curved and the upper portion at the highest position is a flat surface. The raised portion 28 shown in FIG. 3C has an inner lateral surface that is substantially perpendicular to the upper surface of the main body portion 210 of the first lead portion 21a and has an upper surface that is continuous with and substantially perpendicular to the inner lateral surface. In other words, the upper surface of the raised portion 28 shown in FIG. 3C that is at the highest position is substantially parallel to the upper surfaces of the main body portion 210, 220.

The second lead portion 22a is connected only via the connecting portion 25 as described above. Accordingly, the connecting portion 25 connected to the second lead portion 22a preferably has the configuration as below.

The connecting portion 25 connected to the second lead portion 22a preferably includes at least two sub-connecting portions 251 at a single lateral surface of the second lead portion 22a. The second lead portion 22a shown in FIG. 2C includes two sub-connecting portions 251 on one lateral surface. Then, the two sub-connecting portions 251 both connect together the main body portion 220 of the second lead portion 22a and the main body portion 210 of the first lead portion 21a that is adjacent to the second lead portion 22a. With the connecting portion 25 including a plurality of sub-connecting portions 251, it is possible to narrow the width of each sub-connecting portion 251, which allows for facilitating cutting of the lead frame in the separation step. With a plurality of sub-connecting portions 251, the connection strength between the second lead portion 22a and another portion of the lead frame 20 can be maintained, and it is possible to reduce bending of the portion between the second lead portion 22a and the first lead portion 21a. In the connecting portion 25 shown in FIG. 2C, the width of a single sub-connecting portion 251 in the second direction S is narrower than the width of the first suspension portion 23 along the first direction when viewed from above. A total of the widths of the two sub-connecting portions 251 in the second direction S is greater than the width of the first suspension portion 23 along the first direction when viewed from above.

The plurality of sub-connecting portions 251 are preferably arranged in symmetry with respect to the center of a corresponding one of lateral surfaces of the second lead portion 22a.

Figure 4:
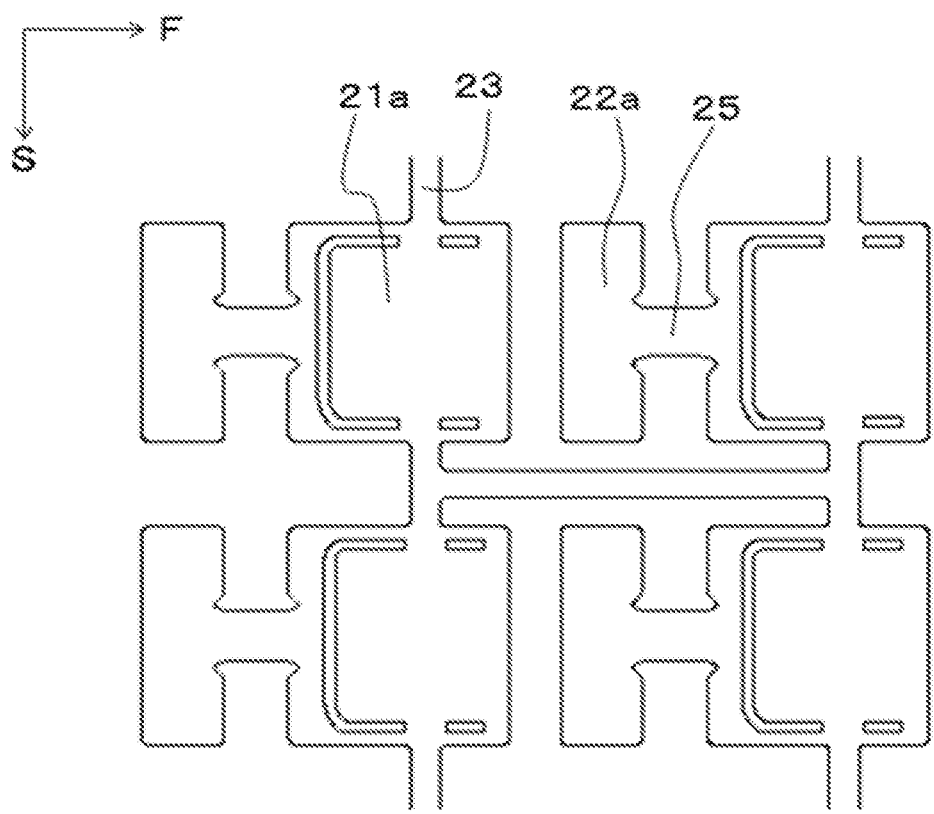
FIG. 4 is a schematic top view showing another preferred configuration of a connecting portion.

Another preferred configuration of the connecting portion 25 connected to the second lead portion 22a is shown in FIG. 4. In the lead frame 20 shown in FIG. 4, a single connecting portion constitutes the connecting portion 25 at a corresponding one of lateral surfaces of the second lead portion 22a. In a plan view, a width of the connecting portion 25 along the second direction S is preferably greater than a width of the first suspension portion 23 along the first direction F. With such a width, it is possible to ensure a large width of the connecting portion 25 connecting together the second lead portion 22a and another portion of the lead frame 20, which is advantageous for maintaining the strength of the second lead portion 22a. In a plan view, a width of the connecting portion 25 along the second direction S is preferably 1.5 to 3 times, more preferably 2 to 2.5 times, the width of the first suspension portion 23 along the first direction F.

In the second direction S, when viewed from above, an inner portion of each sub-connecting portion 251 preferably has a width that is smaller than an outer portion thereof, and an inner portion of the single connecting portion that constitutes the connecting portion 25 preferably has a width that is smaller than an outer portion thereof. This allows for facilitating each sub-connecting portion 251 or a single connecting portion that constitutes connecting portion 25.

Support Portions 26

The lead frame 20 may include a plurality of support portions 26. Each support portion 26 serves to connect a corresponding one of first suspension portions 23 with adjacent one of the first suspension portions 23 in the first direction F, which allows for improving the strength of the lead frame 20 as a whole. With the lead frame 20 including a plurality of support portions 26, in addition to a plurality of first suspension portions 23, etc., the first lead portion 21a of each of the units 1 is connected to the first lead portion 21a of adjacent one of the units 1 in the second direction S and also connected to the first lead portion 21a of another adjacent one of the units 1 in the first direction F.

In the lead frame shown in FIG. 2B, the first suspension portions 23 are arranged in the first direction F and in the second direction S, and each support portion 26 connects a corresponding one of the first suspension portions 23 arranged in the first direction F only to one of first suspension portions 23 that are adjacent to the first suspension portion 23 in the first direction F. That is, a single support portion 26 is not connected to all the first suspension portions 23 in the first direction F. More specifically, of the first suspension portion 23a, the first suspension portion 23b and the first suspension portion 23c, a support portion 26 is connected to the first suspension portion 23b and to the first suspension portion 23c, but is not connected to the first suspension portion 23a. Thus, a support portion 26 is not connected to all the first suspension portions 23 in the first direction F, but connects only some first suspension portions 23 at particular positions. Therefore, when a stress is applied due to a pressing processing or the like, it is possible to reduce the stress in regions such as units that are not connected to support portions 26. Accordingly, it is possible to provide a lead frame with reduced residual stress while ensuring a sufficient strength of the lead frame.

Figure 5:
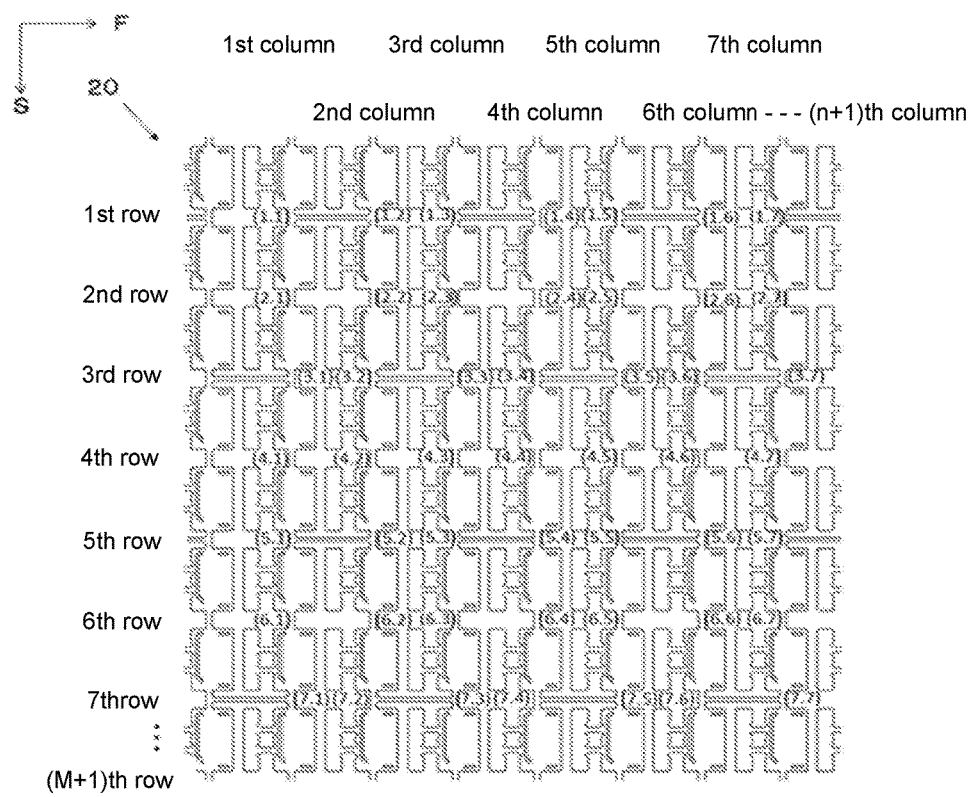
FIG. 5 is a schematic top view illustrating a preferred arrangement of a plurality of support portions.

Next, referring to the lead frame 20 shown in FIG. 5, a preferable arrangement of support portions 26 will be described. In FIG. 5, "(a.b)" indicates a first suspension portion 23 at the intersection of ath row and bth column. A first suspension portion 23 at the intersection of the first row and the first column in FIG. 5 can be any one of the first suspension portions 23 in the lead frame 20.

Either the first suspension portions 23 of even-numbered rows in the second direction S or the first suspension portions 23 of odd-numbered rows in the second direction S is preferably connected to the support portions 26. In other words, the support portions 26 are preferably arranged in the second direction for every other row. With such an arrangement of support portions 26, it is possible to efficiently reduce the stress remaining on the lead frame 20 as a whole. More specifically, in the lead frame 20 shown in FIG. 5, corresponding ones of the $(4n+1)^{th}$ first suspension portions 23 in the second direction S, which are arranged in the first direction F, and corresponding ones of the $(4n+3)^{th}$ first suspension portions 23 in the second direction S, which are arranged in the first direction F, are connected to the support portions 26, and corresponding ones of the $(4n+2)^{th}$ first suspension portions 23 in the second direction S, which are arranged in the first direction F, and corresponding ones of the $(4n+4)^{th}$ first suspension portions 23 in the second direction S, which are arranged in the first direction F, are connected to the support portions 26

Moreover, the support portions 26 are preferably arranged in a staggered pattern. The expression "arranged in a staggered pattern" as used herein refers to an arrangement in which support portions 26 are arranged in a pattern with a predetermined intervals therebetween along one row and in an inverted pattern along another row. That is, along a single column of the first suspension portions 23, support portions 26 are provided at the intersections with one of the rows of the first suspension portions 23, but no support portions 26 are provided at the intersection with another one of the rows of the first suspension portions 23. Moreover, along a single column of the first suspension portions 23, no support portions 26 are provided at the intersection with one of the rows of the first suspension portions 23, but support portions 26 are provided in another one of the rows of the first suspension portions 23.

In the lead frame 20 shown in FIG. 5, the plurality of first suspension portions 23 are arranged in the first direction F and in the second direction S. Where each of m and n represents an integer of 0 or greater, a support portion 26 (i.e., a first support portion 26a) in the $(4n+1)^{th}$ row in the second direction S is connected only to the $(2m+1)^{th}$ one and the $(2m+2)^{th}$ one of the first suspension portions 23 that are arranged in the first direction F. At the $(4n+3)^{th}$ row in the second direction S, a support portion 26 (i.e., a second support portion 26b) is connected only to the $(2m+2)^{th}$ one and the $(2m+3)^{th}$ one of the first suspension portions 23 that are arranged in the first direction F.

The lead frame 20 preferably includes a base member such as copper and a metal layer covering the base member. Examples of the base member includes a metal such as copper, aluminum, gold, silver, iron, nickel, or an alloy thereof, phosphor bronze and iron-containing copper. They may be used as a single layer or may have a layered structure (e.g., a clad material). In particular, copper, which is inexpensive and highly heat-radiating is preferably used for the base member. Examples of the metal layer includes silver, aluminum, nickel, palladium, rhodium, gold, copper, or an alloy thereof. In each lead portion of the lead frame 20, there may be an area where a metal layer is absent. In each lead portion, a metal layer formed at the upper surface may be different from a metal layer formed at the lower surface. For example, the metal layer formed at the upper surface may be a multi-layer metal layer including a metal layer of nickel, and the metal layer formed at the lower surface may be a metal layer not including a metal layer of nickel. The thickness of the metal layer formed at the upper surface is preferably greater than the thickness of the metal layer formed at the lower surface. With such a thickness, light emitted from the light-emitting element 10 can be efficiently reflected by the metal layer at the upper surface side, and a thickness of the metal layer at the lower surface side can be reduced in order to reduce the cost. In the case in which the thickness of the metal layer on the upper surface of the lead part and the thickness of the metal layer on the lower surface of the lead part are different from each other, the metal layer at the upper surface and the metal layer at the lower surface have the same number of the layers while thicknesses of some or all of the layers are different between the metal layer at the upper surface and the metal layer at the lower surface, so that the overall thicknesses may be different between the metal layer at the upper surface and the metal layer at the lower surface. Alternatively, the number of layers at the upper surface of the lead part and the number of layers at the lower surface of the lead part may be different from each other, so that the overall thickness of the metal layer at the upper surface of the lead part and that of the metal layer on the lower surface of the lead part may be different from each other.

In the case where a plating layer of silver or a silver alloy is formed at the uppermost surface of each lead portion, a protective layer of silicon oxide, or the like, is preferably provided on the surface of the plating layer of silver or a silver alloy. Then, it is possible to reduce discoloration of the plating layer of silver or a silver alloy due to a sulfur component in the air. The method of forming the protective layer may be a vacuum process such as sputtering or atomic layer deposition, for example, or may be any other method known in the art.

Resin Portion 30

The resin portion 30 is a member of the resin-covered lead frame 50 and is molded integrally with the lead frame 20. In the resin-covered lead frame 50, a portion of the resin portion 30 forms a package region 90, together with the first lead portion 21a and the second lead portion 22a. The resin portion 30 has inner wall surfaces that define the recess 2 of each package region 90, and the inner wall surfaces upwardly reflects light emitted from the light-emitting element 10, which allows for realizing efficient extraction of light.

As a resin material to be the matrix, a thermosetting resin, a thermoplastic resin, or the like may be used for the resin portion 30. More specifically, a modified epoxy resin composition such as an epoxy resin composition, a silicone resin composition, a silicone-modified epoxy resin, a modified silicone resin composition such as an epoxy-modified silicone resin, a hardened material of an unsaturated polyester resin, a saturated polyester resin, a polyimide resin composition, a modified polyimide resin composition, or the like, or a resin such as polyphthalamide (PPA), a polycarbonate resin, polyphenylene sulfide (PPS), liquid crystal polymer (LCP), an ABS resin, a phenol resin, an acrylic resin or a PBT resin may be used. In particular, a thermosetting resin of an epoxy resin composition, a silicone resin composition or a modified silicone resin composition may be used.

The resin portion 30 preferably further contains a light-reflecting substance. Examples of the light-reflecting substance include titanium oxide, silicon oxide, zirconium oxide, potassium titanate, aluminum oxide, zinc oxide, aluminum nitride, boron nitride, and mullite. With the light-reflecting substance, the resin portion 30 can efficiently reflect light emitted from the light-emitting element 10. For example, in the case in which titanium oxide is used, titanium oxide is contained preferably at an amount of 20 wt % or more and 60 wt % or less, more preferably 25 wt % or more and 55 wt % or less, with respect to the total weight of the resin portion 30. The resin portion 30 preferably has a reflectance of 60% or more, more preferably 90% or more, with respect to light emitted from the light-emitting element 10. In an uncured state, the viscosity of the resin portion 30, uncured, is preferably 10 pa·s to 40 pa·s, and more preferably 15 pa·s to 25 pa·s. With such a viscosity, the resin portion 30 can be formed with good flowability by a molding method using molds.

In order to improve the contrast of the light-emitting device, the resin portion 30 may have a low optical reflectance with respect to external light around the light-emitting device (typically, sunlight). In this case, normally, the color of the resin portion 30 is preferably black or a near-black color. In this case, carbon such as acetylene black, activated carbon and graphite, transition metal oxide such as iron oxide, manganese dioxide, cobalt oxide and molybdenum oxide, or a colored organic pigment, etc., can be selected, as the filler, according the purpose.

Light-Emitting Element 10

A light-emitting element 10 is placed on the bottom surface of the recess 2 of each package region 90. For the light-emitting element 10, a semiconductor light-emitting element such as a light-emitting diode element may be used. Particularly, the light-emitting element 10 preferably includes a nitride semiconductor ($In_xAl_yGa_{1-x-y}N$, $0 \leq x$, $0 \leq y$, $x+y \leq 1$) configured to emit light in the ultraviolet to visible light range. One or two or more light-emitting elements 10 may be placed in a single recess. In the case where two light-emitting elements are placed in a single recess, they may be a light-emitting element configured to emit blue light and a light-emitting element configured to emit green light. In the case where three light-emitting elements are placed in a single recess, they may be a light-emitting element configured to emit blue light, a light-emitting element configured to emit green light and a light-emitting element configured to emit red light. In the case where two or more light-emitting elements 10 are disposed, the light-emitting elements are connected together in a serial connection, a parallel connection, or a combination thereof. The light-emitting element may be placed such that the electrode forming surface faces upward (i.e., face-up mounting) or faces downward (flip-chip mounting).

The light-emitting element 10 is placed on the main body portion of each lead portion via a bonding member therebetween. Examples of the bonding member include a resin such as the resin materials described above as examples of a material of the resin portion 30, a solder such as a tin-bismuth-based solder, a tin-copper-based solder, a tin-silver-based solder and a gold-tin-based solder, a conductive paste of silver, gold, palladium, or the like, a brazing material such as a bump, an anisotropic conductive material and a low melting point metal, etc.

Protective Element 11

A protective element 11 may be disposed on the bottom surface of the recess of each package region 90. The protective element 11 is an element for protecting the light-emitting element from static electricity or high-voltage surge. Specific examples of the protective element 11 include a Zener diode. In order to reduce absorption of light emitted from the light-emitting element 10 by the protective element 11, the protective element 11 may be coated with a light-reflecting member such as a white resin. In the package region 90, the protective element 11 and the light-emitting element 10 are electrically connected to each other in parallel.

Sealing Member 3

After the light-emitting element 10, or the like, is placed in the recess, a sealing member 3 may be arranged in the recess of the package region 90. The sealing member 3 is capable of covering the light-emitting element 10, or the like, located on the bottom surface of the recess 2, and protecting the light-emitting element 10, or the like, from external force, dust, moisture, etc.

The sealing member 3 preferably transmits 60% or more, more preferably 90% or more, of the light emitted from the light-emitting element 10. Examples of the material of the sealing member 3 include a resin material used for the resin portion 30. For a resin to be the matrix, a thermosetting resin, a thermoplastic resin, or the like, such as a silicone resin, an epoxy resin, an acrylic resin or a resin containing at least one of these can be used. The sealing member 3 may be made of a single layer or may be made of a plurality of layers. Light scattering particles such as titanium oxide, silicon oxide, zirconium oxide and aluminum oxide may be dispersed in the sealing member 3.

The sealing member 3 may include a material (a phosphor, or the like) adapted to convert the wavelength of light from the light-emitting element 10. Specifically, examples of a phosphor include cerium-activated yttrium aluminum garnet, cerium-activated lutetium aluminum garnet, europium- and/or chromium-activated nitrogen-containing alumino-calcium silicate (a portion of calcium may be substituted with strontium), europium-activated SiALON, europium-activated silicate, europium-activated strontium aluminate, manganese-activated potassium fluorosilicate, or the like.

The content of light-scattering particles and/or a phosphor is preferably about 10 to 100 wt % with respect to the total weight of the sealing member 3, for example.

Method of Manufacturing Light-Emitting Device 100 Using Lead Frame 20

One embodiment of a method for manufacturing a light-emitting device using the lead frame 20, which is the first embodiment of the present disclosure, will be described. The method of manufacturing a light-emitting device of the present disclosure includes (A) providing a lead frame, (B) providing a resin-covered lead frame, (C) mounting light-emitting elements on the resin-covered lead frame, and (D) singulating the resin-covered lead frame into a plurality of light-emitting devices. The steps will now be described below in detail.

(A) Step of Preparing Lead Frame

Figure 6A:
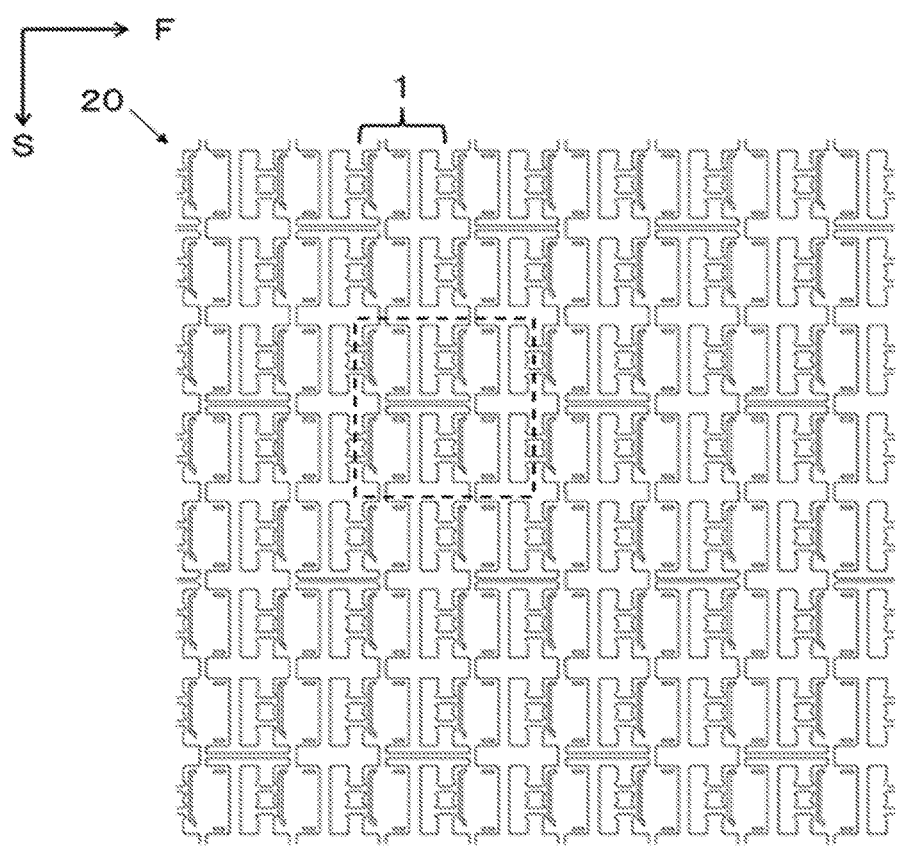
FIG. 6A is a schematic top view showing a lead frame before being subjected to a pressing process.
Figure 6B:
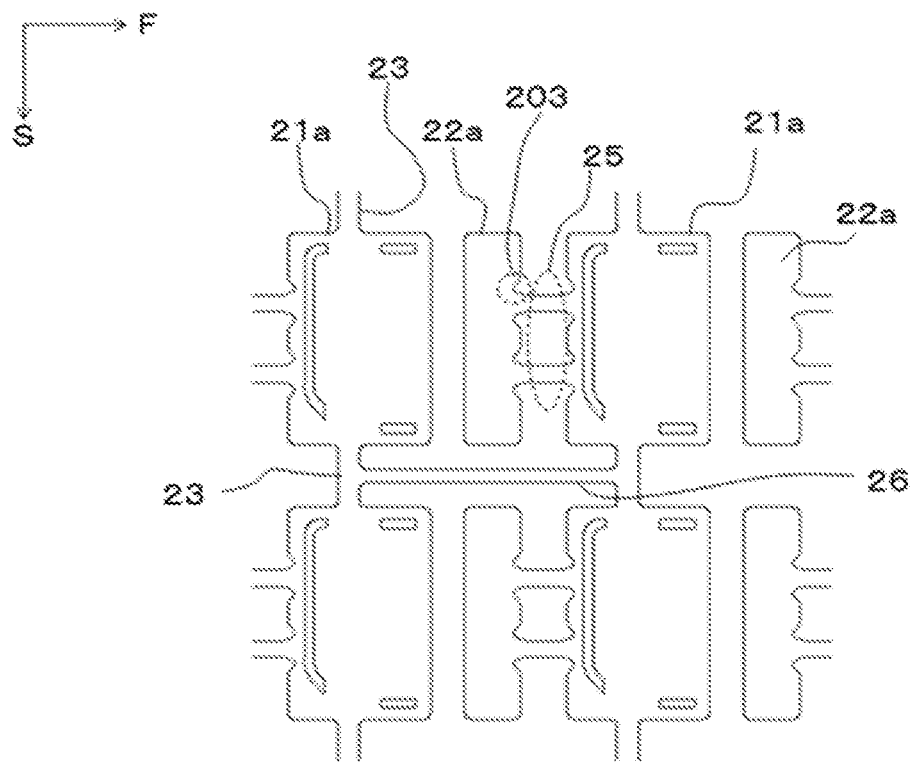
FIG. 6B is a partial enlarged view showing an area surrounded by a broken line in FIG. 6A.

The lead frame 20 before being subjected to a pressing processing is provided. FIG. 6A is a schematic top view showing a part of the lead frame before being subjected to a pressing processing, and FIG. 6B is a partial enlarged view showing a portion surrounded by a broken line of FIG. 6A. The lead frame 20 includes a plurality of units 1 each including the first lead portion 21a and the second lead portion 22a, a plurality of first suspension portions 23, and a plurality of connecting portions 25. The lead frame 20 shown in FIG. 6A and FIG. 6B further includes a plurality of support portions 26.

The second lead portion 22a is not connected to any portion of the lead frame other than the connecting portion 25. With this arrangement, when the connecting portion 25, the first suspension portion 23 and the support portion 26 of the lead frame 20 are subjected to a pressing process, the stress applied on the first lead portion 21a and the second lead portion 22a can be released on the second lead portion 22a side, and it is possible to reduce the stress remaining on the lead frame 20. Accordingly, it is possible to reduce the distortion or warpage of the lead frame 20.

Next, a part of each connecting portion 25, a part of each first suspension portion 23 and a part of each support portion 26 are pressed from the lower surface side toward the upper surface side. By pressing respective parts from the lower surface side toward the upper surface side, the depression 29 is formed on the lower surface of the part, and the raised portion 28 is formed on the upper surface side opposite to the depression 29. In this manner, with the depression 29 and the raised portions 28 formed in the lead frame 20, the contact area between the resin portion 30 and the lead frame 20 can be increased in the step of forming the resin portion 30, and it is therefore possible to improve the adhesion between the resin portion 30 and the lead frame 20. Moreover, the resin portion 30 can be arranged in the depression 29, the lead frame 20 can be sandwiched by the resin portion 30 from the upper surface side and the lower surface side, and it is possible to improve the adhesion between the resin portion 30 and the lead frame 20.

A metal layer is formed at a surface of the lead frame 20 before or after the pressing process. Preferably, the metal layer at a surface of the lead frame 20 is formed after the pressing process. This allows for preventing roughening of the surface of the metal layer or detaching of the metal layer due to stress generated by the pressing processing.

In the lead frame 20 shown in FIG. 6B, a portion of the first lead portion 21a and a portion the second lead portion 22a of the main body portions 210 and 220 in the vicinity of the connecting portion 25 extending in the first direction F include portions that are recessed inwardly (i.e., notched portion 203) in the respective lateral surfaces of the first lead portion 21a and the second lead portion 22a. With the notch portions 203 defined in each of the main body portions 210, 220 at a portion in the vicinity of the connecting portion 25, it is possible to ensure a sufficient length of the connecting portion 25 in the first direction F. Thus, it is possible to ensure a wide area where the connecting portion 25 can be pressed, and it is possible to increase an area of raised portions 28 and depressions 29. Accordingly, it is possible to improve the adhesion between the lead frame 20 and the resin portion 30. With the notch portions 203 defined by each lateral surface of the first lead portion 21a and the second lead portion 22a, the surface area in contact with the resin portion 30 increases, which allows for improving the adhesion between the lead frame 20 and the resin portion 30.

(B) Providing Resin-Covered Lead Frame

Figure 7A:
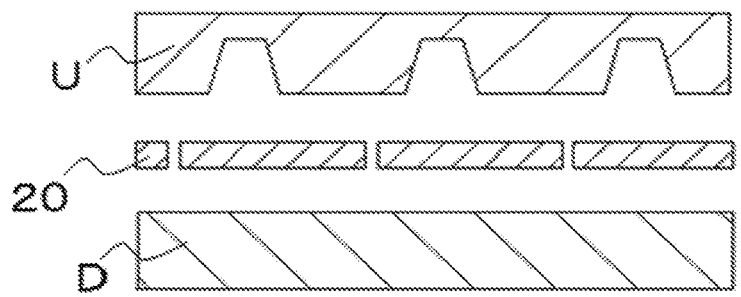
FIG. 7A is a diagram illustrating molds used in the step of providing a resin-covered lead frame.
Figure 7B:
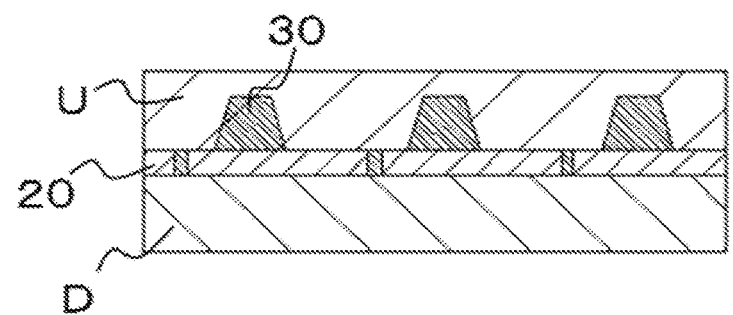
FIG. 7B is a diagram illustrating a resin material being placed between the molds.

Next, the lead frame 20 having been subjected to the pressing process is disposed between dies including an upper mold U having protrusions and a lower mold D shown in FIG. 7A. Then, as shown in FIG. 7B, an uncured resin material to be the resin portion 30 is injected into the space inside the mold defined by the upper mold U and the lower mold D. At this time, in each package region, an region to be attached with the protrusion of the upper die corresponds to a recess 2, and a region that is not attached with the protrusion will become a space where the resin portion 30 is formed. Examples of the method for integrally molding the lead frame 20 and the resin portion 30 together include a transfer molding method, an injection molding method, a compression molding method, or the like.

Next, after the injection of the uncured resin material, the resin material is subjected to heating at a predetermined temperature in the mold to perform pre-curing. Then, the molds are detached, and the resin material is heated at a higher temperature than that in the pre-curing to perform curing of the resin material. Thus, the resin portion 30 is formed on the lead frame 20, so that the resin-covered lead frame 50 having a plurality of recesses at the upper side can be formed.

Instead of providing the resin-covered lead frame 50 by manufacturing as described above, a resin-covered lead frame 50 that has been manufactured may be purchased, for example.

(C) Mounting Light-Emitting Elements on Resin-Covered Lead Frame

Figure 8:
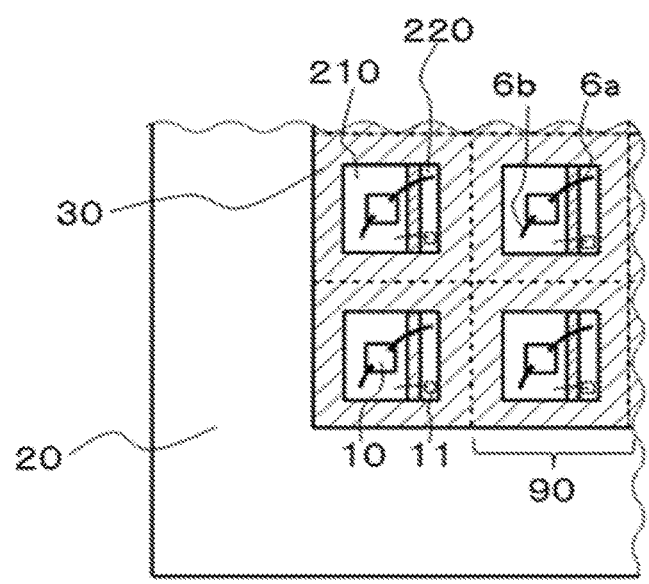
FIG. 8 is a diagram illustrating light-emitting elements placed in package regions.

Next, referring to FIG. 8, the light-emitting element 10 is placed on the bottom surface of the recess of each package region 90. The light-emitting element 10 is placed on the main body portion 210 of the first lead portion 21a using a bonding member such as a resin described above. The light-emitting element 10 is electrically connected to the first lead portion 21a and the second lead portion 22a via wires 6a and 6b, etc. Where the protective element 11 is provided, the protective element 11 is placed on the main body portion 220 of the second lead portion 22a in the recess and is electrically connected the first lead portion 21a via a wire, or the like.

Next, the sealing member 3 covering the light-emitting element 10, or the like, is preferably formed in the recess. This allows for protecting the light-emitting element 10, or the like, from external force, dust, moisture, etc. The sealing member 3 contains a phosphor such as cerium-activated yttrium aluminum garnet.

(D) Singulating Resin-Covered Lead Frame into Light-Emitting Devices

Next, the resin-covered lead frame 50 is singulated into a plurality of light-emitting devices 100. Examples of the method of separating the resin-covered lead frame 50 includes various methods, such as cutting using a lead cutting die, a dicing saw or laser light.

In the case where the singulation is performed by cutting the resin-covered lead frame 50, it is preferred to cut the resin-covered lead frame 50 along the support portions 26. That is, the resin-covered lead frame 50 is preferably cut so that no support portion 26 remains on the singulated light-emitting device 100. Thus, it is possible to prevent a part of the support portion 26 from being located at the outer lateral surface of the singlated light-emitting device 100, and it is possible to reduce the possibility of an electric malfunction due to the part of the support portion 26 located at the outer lateral surface.

In order to prevent a portion of the support portion 26 from remaining in the light-emitting device 100, the blade width of a dicing saw for dicing the support portion 26 is preferably greater than the width of the support portion 26. According to the manufacturing method of the present embodiment, the lead frame 20 and the resin portion 30 are cut at the same time in the step of singulating the resin-covered lead frame 50. Thus, a plurality of light-emitting devices 100 as shown in FIG. 9A to FIG. 9D are obtained.

Figure 9A:
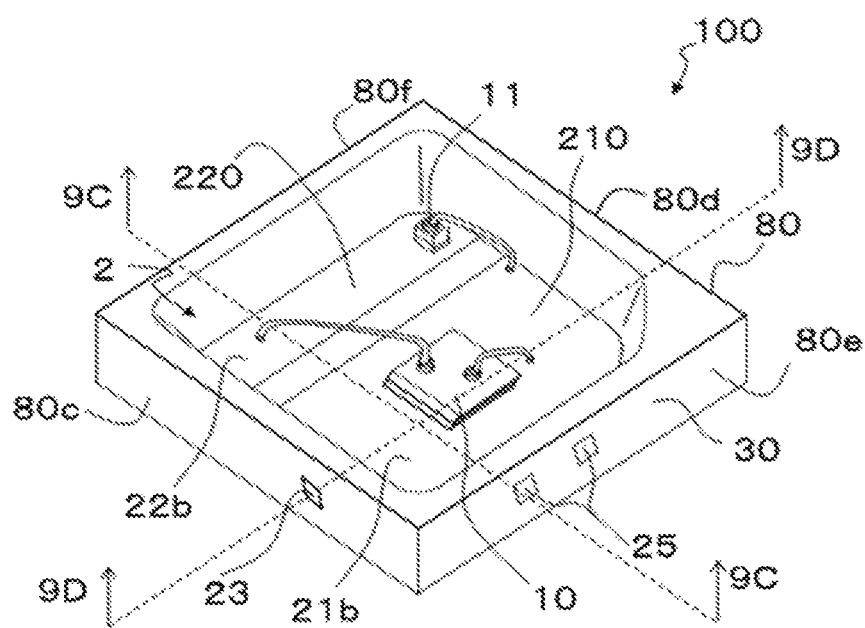
FIG. 9A is a schematic perspective view showing a light-emitting device when viewed from the upper surface side.
Figure 9B:
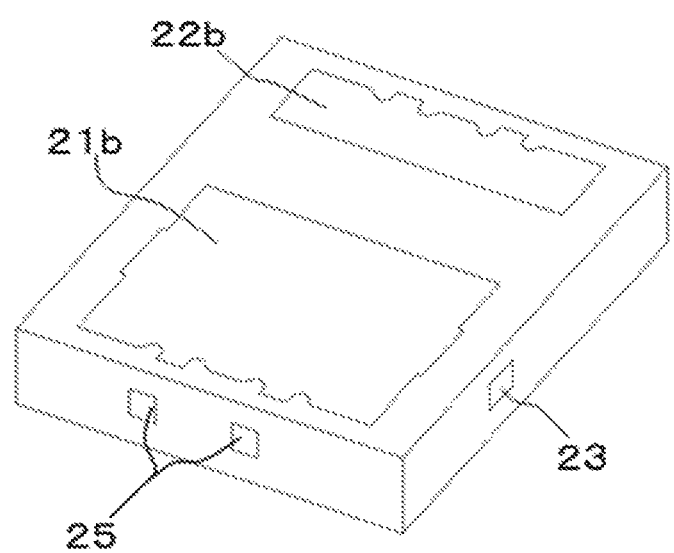
FIG. 9B is a schematic perspective view showing a light-emitting device when viewed from the lower surface side.
Figure 9C:
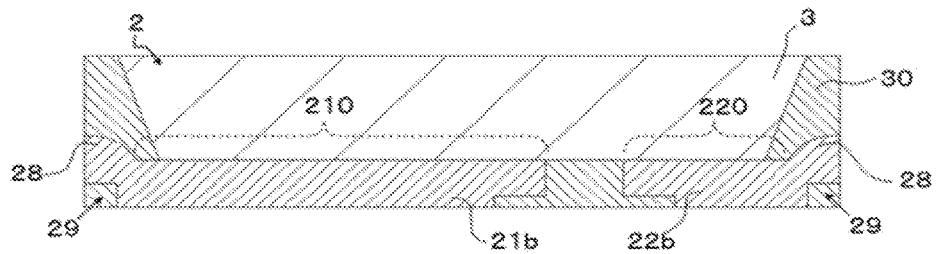
FIG. 9C is a schematic end view taken along line 9C-9C in FIG. 9A.
Figure 9D:
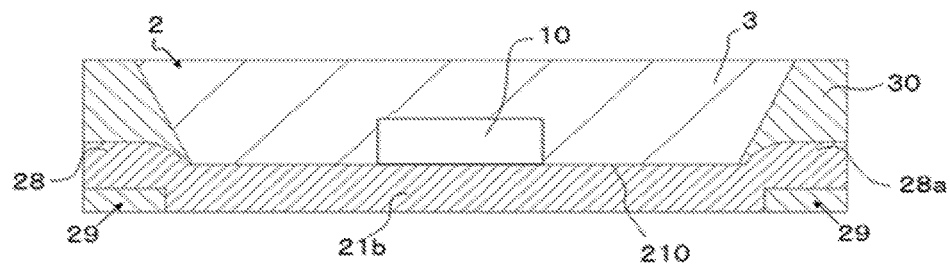
FIG. 9D is a schematic end view taken along line 9D-9D in FIG. 9A.

Next, referring to FIG. 9A to FIG. 9D, a singulated light-emitting device 100 will be described. FIG. 9A is a schematic perspective view showing the light-emitting device 100 when viewed from the upper surface side. FIG. 9B is a schematic perspective view showing the light-emitting device 100 when viewed from the lower surface side. FIG. 9C is a schematic end view taken along line 9C-9C of FIG. 9A. FIG. 9D is a schematic end view taken along line 9D-9D of FIG. 9A. Note that wires, etc., are not shown in the schematic end views of FIG. 9C and FIG. 9D.

Light-Emitting Device 100

The light-emitting device 100 manufactured as described above includes the resin portion 30, a resin package 80 including a first lead 21b and a second lead 22b, and the light-emitting element 10 mounted on the resin package 80. The light-emitting device 100 may further include the sealing member 3.

Resin Package 80

The resin package 80 includes a plurality of leads including the first lead 21b and the second lead 22b, and the resin portion 30 molded integrally with the plurality of leads. The first lead 21b and the second lead 22b correspond to the first lead portion 21a and the second lead portion 22a of the lead frame 20 described above, respectively. The first lead 21b includes the main body portion 210, and a part of the connecting portion 25 and a part of the first suspension portion 23 connected to the main body portion 210. The second lead 22b includes the main body portion 220, and a part of the connecting portion 25 connected to the main body portion 220.

The resin package 80 shown in FIG. 9A is a housing and includes the recess 2. Apart of the upper surface of the first lead 21b and a part of the upper surface of the second lead 22b are located at the bottom surface of the recess 2, and the light-emitting element 10 is arranged in the recess 2. The resin package 80 has an upper surface, and a lower surface that is located opposite to the upper surface. The resin package 80 has a substantially rectangular outer shape when viewed from above. Therefore, the resin package 80 has four outer lateral surfaces, i.e., an outer lateral surface 80c, an outer lateral surface 80d opposite to the outer lateral surface 80c, an outer lateral surface 80e, and an outer lateral surface 80f opposite to the outer lateral surface 80e. In the light-emitting device 100, a part of the first suspension portion 23 of the first lead 21b is exposed from the resin portion 30 at the outer lateral surface 80c and at the outer lateral surface 80d, and the part of the first suspension portion 23 exposed from the resin portion 30 and the resin portion 30 are substantially in the same plane. At the outer lateral surface 80e, a part of the connecting portion 25 of the first lead 21b is exposed from the resin portion 30, and the part of the connecting portion 25 exposed from the resin portion 30 and the resin portion 30 are substantially in the same plane. At the outer lateral surface 80f, a part of the connecting portion 25 of the second lead 22b is exposed from the resin portion 30, and the part of the connecting portion 25 exposed from the resin portion 30 and the resin portion 30 are substantially in the same plane.

The first lead 21b and the second lead 22b each have an upper surface, and a lower surface that is located opposite to the upper surface. The upper surface of the first lead 21b and the upper surface of the second lead 22b are arranged to be substantially in the same plane, and the lower surface of the first lead 21b and the lower surface of the second lead 22b are arranged to be substantially in the same plane.

As shown in FIG. 9B, at the lower surface of the resin package 80, the lower surface of the first lead 21b and the lower surface of the second lead 22b are exposed from the resin portion 30.

The connecting portion 25 and the first suspension portion 23 of the light-emitting device 100 have depressions 29 at the lower surface that are depressed from the lower surface side toward the upper surface side, as shown in FIG. 9C and FIG. 9D. At a side opposite to the depressions 29, the connecting portion 25 and the first suspension portion 23 includes raised portions 28 that are raised to positions higher than the upper surfaces of the main body portions 210 and 220 of the first lead 21b and the second lead 22b, respectively. With the first lead 21b and the second lead 22b each having the depressions 29 and the raised portions 28, the contact area between the resin portion 30 and the first lead 21b or the second lead 22b is increased, and it is therefore possible to improve the adhesion between the resin portion 30 and the first lead 21b or the second lead 22b.

The outer shape of the resin package 80 when viewed from above is not limited to a rectangular shape but may be any other shape. Further, the resin package 80 may have an anode mark or a cathode mark that is defined by chamfering one corner of the opening, when viewed from above. An anode mark or a cathode mark serves as a mark indicating the polarity of the two leads.

Second Embodiment

Figure 10:
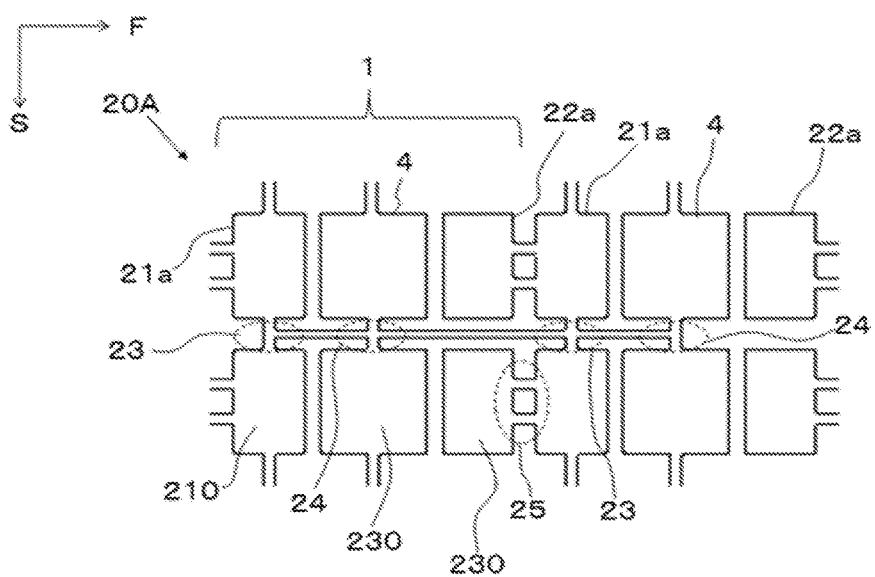
FIG. 10 is a schematic top view showing four units of a lead frame according to a second embodiment of the present disclosure.

A lead frame 20A, which is a second embodiment of the present disclosure, will be described. FIG. 10 is a schematic top view showing four of units 1 of the lead frame 20A when viewed from the upper surface side. The lead frame 20A of the second embodiment is different from the lead frame 20 of the first embodiment in that the lead frame 20A includes three lead portions and a plurality of second suspension portions 24. Other configurations in the lead frame 20A is similar to that in the lead frame 20.

The lead frame 20A includes a plurality of units 1 arranged in the first direction F and in the second direction S. Each unit 1 includes the first lead portion 21a, the second lead portion 22a and a third lead portion 4, and the first lead portion 21a, the third lead portion 4 and the second lead portion 22a are arranged in this order in the first direction F.

The first lead portion 21a, the second lead portion 22a and the third lead portion 4 of each of the units 1 are adjacent, in the second direction S, to the first lead portion 21a, the second lead portion 22a and the third lead portion 4, respectively, of an adjacent one of the units 1 that is adjacent in the second direction S.

The first lead portion 21a, the second lead portion 22a and the third lead portion 4 include a main body portion 210, 220, 230, and a part of the first suspension portion 23 and/or a part of the connecting portion 25 connected to the main body portions 210, 220, 230, respectively. For example, the light-emitting element 10 is mounted on the main body portion 230, and wires or the like connected to the light-emitting element are connected to the main body portions 210 and 220.

The first suspension portion 23 connects together, in the second direction S, the first lead portions 21a of two of the units 1 that are adjacent to each other in the second direction S. The connecting portion 25 connects the first lead portion 21a of one of the units 1 with the second lead portion 22a of adjacent one of the units 1 that is adjacent in the first direction F.

The lead frame 20A further includes a plurality of second suspension portions 24. Each second suspension portion 24 connects together, in the second direction S, the third lead portions 4 of adjacent ones of units 1 that are adjacent to each other in the second direction S. The third lead portion 4 is not connected to the first suspension portion 23 and the connecting portion 25, and is only connected to the second suspension portion 24.

The second lead portion 22a is not connected to any portion of the lead frame other than the connecting portion 25, i.e., not connected to the first suspension portion 23, the second suspension portion 24 and the support portion 26. Thus, the stress applied on the first lead portion 21a, the second lead portion 22a and the third lead portion 4 can be released on the second lead portion 22a side, and it is possible to reduce the stress remaining on the lead frame 20A. As a result, it is possible to reduce the distortion or warpage of the lead frame 20A.

The lead frame 20A shown in FIG. 10 may include a plurality of support portions 26. Each support portion 26 connects the first suspension portion 23 and the second suspension portion 24 that are connected to one of units 1 with the first suspension portion 23 and the second suspension portion 24 of another unit 1 that is adjacent to the unit 1 in the first direction F. With a plurality of the support portions 26, the strength of the lead frame 20A can be improved as a whole.

While exemplary embodiments of the present invention have been described above, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A lead frame comprising:
    a plurality of units each including a first lead portion and a second lead portion arranged in a first direction, wherein the units are arranged in the first direction and in a second direction perpendicular to the first direction, and the first lead portion and the second lead portion of each unit are adjacent, in the second direction, to the first lead portion and the second lead portion of an adjacent one of the units that is adjacent in the second direction;
    a plurality of first suspension portions; and
    a plurality of connecting portions,
    wherein each of the first suspension portions connects, in the second direction, the first lead portions of units that are adjacent to each other in the second direction,
    wherein each of the connecting portions connects the first lead portion of a corresponding one of the units and the second lead portion of an adjacent one of the units that is adjacent to the corresponding one of the units in the first direction, and
    wherein the second lead portion of each of the units is connected to the first lead portion of the adjacent one of the units only via the connecting portion.

2. The lead frame according to claim 1, wherein:
    the first suspension portions are arranged in the first direction and in the second direction,
    the lead frame further comprises a plurality of support portions, and
    each of the support portions connects a corresponding one of the first suspension portions arranged in the first direction with only one of two first suspension portions that are adjacent to the corresponding one of the first suspension portions on the both sides of the corresponding one of the first suspension portions in the first direction.

3. The lead frame according to claim 2, wherein the support portions are connected only to even-numbered rows of the first suspension portions in the second direction or only to odd-numbered rows of the first suspension portions in the second direction.

4. The lead frame according to claim 2, wherein the support portions are arranged in a staggered pattern in the first direction and the second direction.

5. The lead frame according to claim 1, wherein:
the first suspension portions are arranged in the first direction and in the second direction,
the lead frame further includes a plurality of support portions including a plurality of first support portions and a plurality of second support portions,
where m and n each represents an integer of 0 or greater,
each of the first support portions is connected only to a $(2m+1)^{th}$ one and a $(2m+2)^{th}$ one of the first suspension portions that are arranged in the first direction along $(4n+1)^{th}$ first suspension portions in the second direction; and
each of the second support portions is connected only to a $(2m+2)^{th}$ one and a $(2m+3)^{th}$ one of the first suspension portions that are arranged in the first direction along a $(4n+3)^{th}$ first suspension portions in the second direction.

6. The lead frame according to claim 5, wherein the support portions are not connected to the first suspension portions that are arranged in the first direction along a $(4n+2)^{th}$ first suspension portion and a $(4n+4)^{th}$ first suspension portion in the second direction.

7. The lead frame according to claim 1, wherein the lead frame has a substantially rectangular shape that is elongated in the first direction when viewed from above.

8. The lead frame according to claim 2, wherein a part of an upper surface of the first suspension portion, a part of an upper surface of the connecting portion and a part of an upper surface of the support portion are at a higher position than a position of upper surface of main body portion of each of the first lead portion and the second lead portion.

9. The lead frame according to claim 1, wherein a width of the connecting portion along the second direction is greater than a width of the first suspension portion along the first direction when viewed from above.

10. The lead frame according to claim 1, wherein each of the units further includes a third lead portion arranged between the first lead portion and the second lead portion.

11. The lead frame according to claim 10, wherein:
the lead frame further comprises a plurality of second suspension portions; and
each of the second suspension portions connects, in the second direction, the third lead portions of adjacent ones of the units that are adjacent to each other in the second direction.

* * * * *